United States Patent [19]

McDonnell

[11] Patent Number: 5,370,841
[45] Date of Patent: Dec. 6, 1994

[54] MICROWAVE LEAKAGE DETECTOR

[76] Inventor: Joseph A. McDonnell, 7518 SW. 26th Ct., Davie, Fla. 33314

[21] Appl. No.: 128,074

[22] Filed: Sep. 29, 1993

Related U.S. Application Data

[63] Continuation of Ser. No. 982,037, Nov. 24, 1992, abandoned, which is a continuation of Ser. No. 617,590, Nov. 26, 1990, abandoned.

[51] Int. Cl.$^5$ ............................................ G01N 31/00
[52] U.S. Cl. ......................................... 422/58; 374/162; 422/60; 428/1
[58] Field of Search ............ 422/58, 60; 324/95, 324/106; 340/600; 374/162; 428/1

[56] References Cited

U.S. PATENT DOCUMENTS

| | | | |
|---|---|---|---|
| 3,619,254 | 11/1971 | Davis | 428/1 |
| 3,693,084 | 9/1972 | Angustine | 324/95 |
| 4,051,435 | 9/1977 | Fanslon | 324/95 |
| 4,065,655 | 12/1977 | Wong et al. | 219/10.55 D |
| 4,089,588 | 5/1978 | de Zwart et al. | 359/91 |
| 4,310,577 | 1/1982 | Davison et al. | 428/1 |
| 4,467,278 | 8/1984 | Toth et al. | 324/95 |
| 4,468,137 | 8/1984 | Hilsum et al. | 374/162 |
| 4,893,906 | 1/1990 | Makon | 428/1 |

FOREIGN PATENT DOCUMENTS

| | | | |
|---|---|---|---|
| 0075481 | 6/1977 | Japan | 374/162 |
| 2165646 | 4/1986 | United Kingdom | 374/162 |
| 2199981 | 7/1988 | United Kingdom | 374/162 |

*Primary Examiner*—W. Gary Jones
*Assistant Examiner*—Laura E. Collins

[57] ABSTRACT

A microwave leakage detector comprises
(a) a flat support member;
(b) a region of resistive coating capable of being heated by microwave radiation;
(c) a plurality of liquid crystal test indicators disposed over and in thermal contact with the resistive coating, each of the test indicators exhibiting color play within a different, greater than ambient temperature range; and
(d) at least one liquid crystal control indicator disposed on the support member at a location away from the resistive coating which exhibits color play at ambient temperature.

22 Claims, 2 Drawing Sheets

MICROWAVE LEAKAGE DETECTOR

This is a continuation of application Ser. No. 07/982,037, filed on Nov. 24, 1992, now abandoned, upon the filing hereof, which was a continuation of application Ser. No. 07/617,590, filed Nov. 26, 1990, now abandoned.

BACKGROUND OF THE INVENTION

This application relates to a liquid crystal-based detector card for detecting leakage from microwave generating devices such as microwave ovens.

Liquid crystals undergo color changes, sometimes called "color play," depending on the temperature of the crystals. This phenomenon has been employed in the construction of microwave detectors, e.g., in U.S. Pat. No. 4,051,435, incorporated herein by reference. The present application also makes use of this phenomenon, but provides reduced risk of error and improved sensitivity due to the unique arrangement of test and control liquid crystal indicators.

SUMMARY OF THE INVENTION

These advantages are provided in a microwave leakage detector comprising
(a) a flat support member;
(b) a region of resistive coating capable of being heated by microwave radiation;
(c) a plurality of liquid crystal test indicators disposed over and in thermal contact with the resistive coating, each of said test indicators exhibiting color play within a different, greater than ambient temperature range; and
(d) at least one liquid crystal control indicator disposed on the support member at a location away from the resistive coating, said control indicator exhibiting color play at ambient temperature. The control indicator acts to prevent false readings caused by an increase in the temperature around the microwave oven rather than a microwave leak.

DETAILED DESCRIPTION OF THE INVENTION

Figure 1:
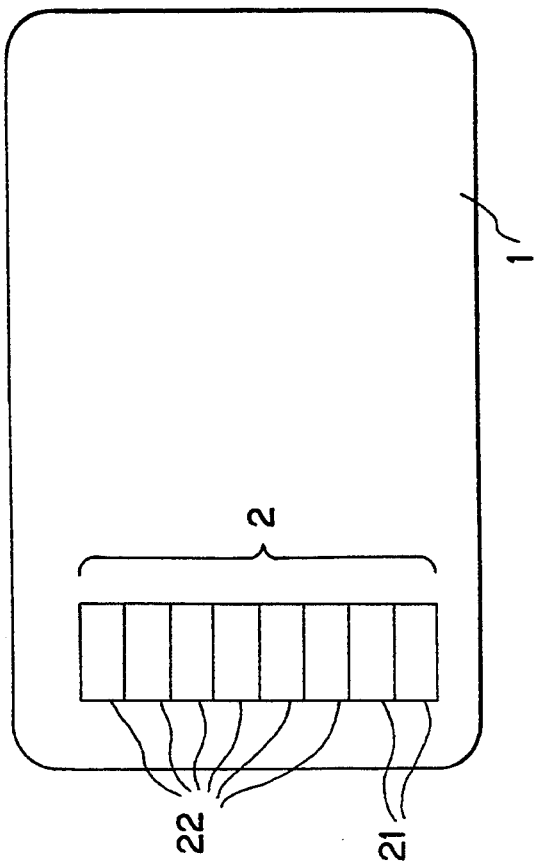
FIG. 1 shows a top view of a microwave detector according to the invention.

FIG. 1 shows a top view of a microwave detector comprising a flat support member 1 on which a plurality of liquid crystal indicators 2 are disposed. The support member is advantageously a thin (preferably 8 to 20 mil) sheet of a rigid plastic such as polyvinylchloride commonly employed in the manufacture of credit cards.

Liquid crystals for use in this invention are commercially available and are fabricated to undergo color play at the temperature ranges specified by the customer. Generally, the liquid crystals are formulated from mixtures of cholesterol esters as described in Brown et al., Chem. Rev. 57:1049 (1957) and Asasup, Agnew Chem. (Int. Ed.) 7:97 (1968) although other materials are known. (See U.S. Pat. No. 3,619,254). The desired temperature range and the width of the temperature range ("band width") are achieved by empirically adjusting the mixture and observing its properties.

Mixtures of cholesterol oleylcarbonate (OCC), cholesterol nonanoate (CN) and cholesterol propionate (CP) can be advantageously used to formulate liquid crystals for use in the present invention. Formulations of the desired temperature range are obtained by balancing the relative amounts of the different constituents in view of the following observed effects.

|     | TEMPERATURE | BAND WIDTH    |
| --- | ----------- | ------------- |
| OCC | Lowers      | Little Effect |
| CN  | Raises      | Little Effect |
| CP  | Lowers      | Broadens      |

Figure 2:
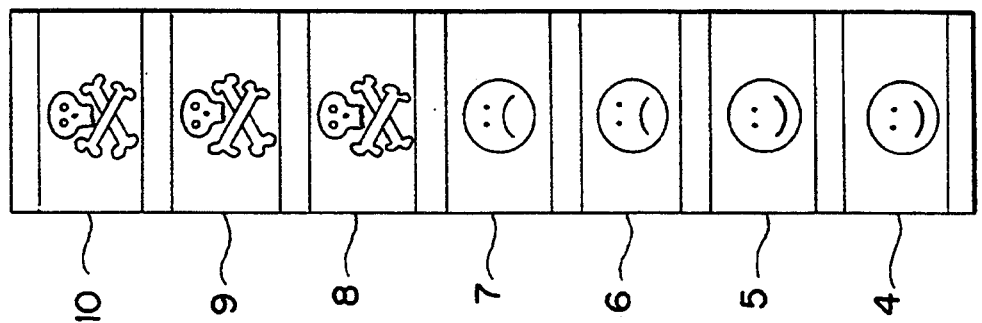
FIG. 2 is a detailed view of a liquid crystal array according to the invention.

The liquid crystal indicators 2 are divided into two groups: a plurality of liquid crystal test indicators 21 and one or more liquid crystal control indicators 22. The control indicators 22 are constructed so as to give color play at temperatures corresponding to ambient conditions. For example, in a preferred embodiment shown in FIG. 2, there are two control indicators 4, 5 exhibiting color play at 69°–74° F. and 74°–80° F., respectively. The control indicators preferably include a favorable hidden image such as the smiling face shown in FIG. 2.

The test indicators are a series of liquid crystals which exhibit color play at a successively higher, greater than ambient temperatures. For example, with reference to FIG. 2, color play of the liquid crystal test indicators might suitably be 83°–89° F. (indicator 6); 90°–96° F. (indicator 7); 97°–103° F. (indicator 8); 106°–112° F. indicator 9); and 119°–125° F. (indicator 10). Unfavorable hidden images such as the frowning face or the skull and cross bones shown in FIG. 2 may be included to assist in interpretation of the detector results. The test indicators are disposed over a resistive layer, e.g., a coating with a resistance of 150–400 ohms/square, such that they will be heated if exposed to perpendicular radiation of 1–10 mw/cm$^2$.

To use the detector of the invention, a microwave oven to be tested is turned on at full power for about 90 seconds. A cup of water should be placed in the oven for safety. The detector card is held at a point away from the liquid crystal array to avoid heating of the liquid crystals by the users hand and slowly moved around the periphery of the door. In this way, perpendicularly propagated radiation, if present, is absorbed by the resistive coating, leading to heating of the test indicators. At the end of the 90 seconds, color play in the control indicators only is indicative of an oven without leakage. Color play in both a control indicator and a test indicator is indicative of an oven that has microwave leakage. Color play in just a test indicator is indicative of an invalid test because the temperature of detector exceeds the temperature which can produce color play in the test region.

Figure 3:
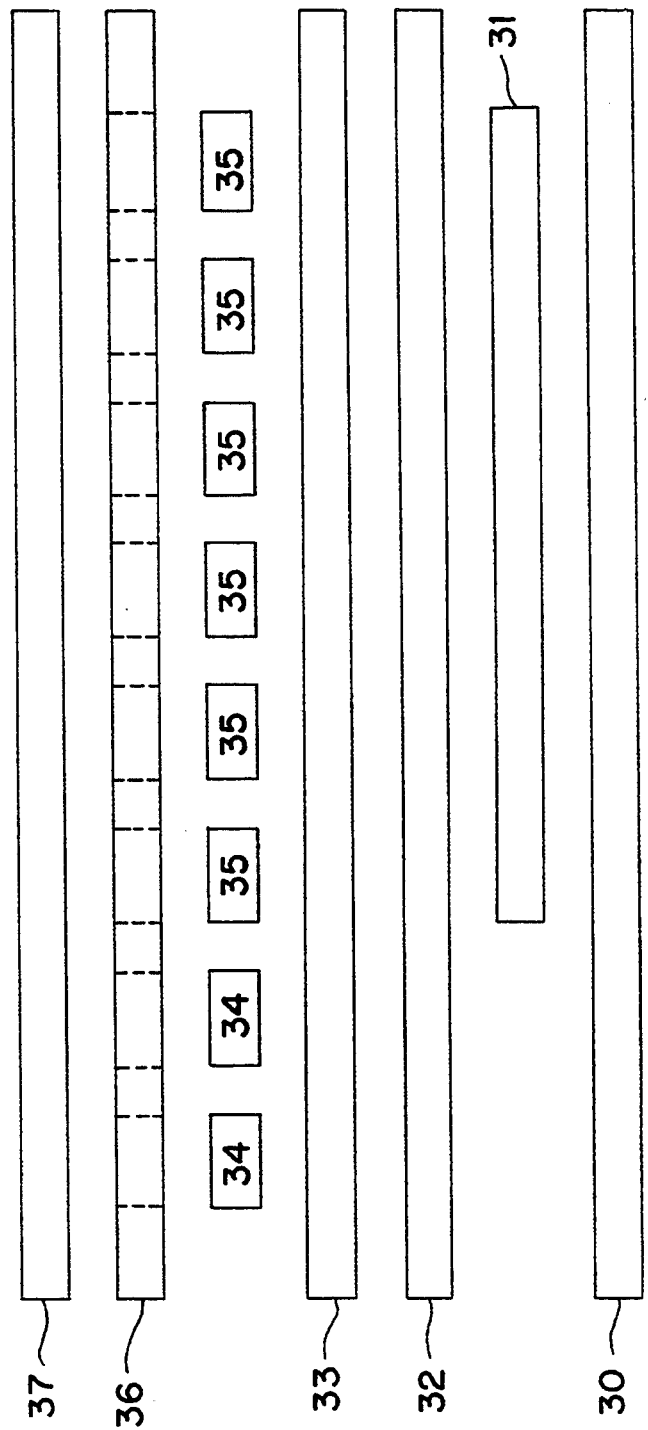
FIG. 3 shows an exploded view of the layers making up the liquid crystal display in accordance with the invention.

FIG. 3 shows an exploded cross section view of a liquid crystal strip for use on detector card in accordance with the invention. As shown the strip is formed on a release sheet 30 which can be removed when the strip is to be placed on a support member. A resistive coating 31 is disposed on a portion of the release strip 30. A mylar film 32 and a black backing 33 are disposed over the entire resistive coating 31 and release sheet 30. Individual liquid crystal indicators are then formed, with the test indicators 34 being formed over the resistive coating 31 so as to be in thermal contact. Control indicators 35 are formed remote from the resistive coating 31. Finally, a mask 36 having openings around each liquid crystal indicator and a mylar top film 37 are placed over the liquid crystal.

EXAMPLE

A microwave detector in accordance with the invention was prepared having a linear array of seven liquid crystals indicators (obtained from Seven C's Incorporated of St. Louis, Mo.) as follows.

|  | Box # | Color-Play/ Temperature | Hidden Image |
| --- | --- | --- | --- |
| control indicator | 1 | 69–74 | Smiling Face |
|  | 2 | 74–80 | Smiling Face |
| test indicators | 3 | 86–89 | Frowning Face |
|  | 4 | 90–96 | Frowning Face |
|  | 5 | 97–103 | Skull & Crossbones |
|  | 6 | 106–112 | Skull & Crossbones |
|  | 7 | 119–125 | Skull & Crossbones |

Hidden images were incorporated in each of the test indicators as shown above. This detector was used to detect leakage from a microwave oven (2,450 MHz) with intentionally loosened door hinges and an obstruction placed in the door.

The door hinges on the lower left portion of the microwave oven were loosened and a beaker with 500 ml of water was placed inside the microwave oven. A spacer was then placed between the door (where loosened) and the microwave oven itself. The detector card was attached to the microwave oven directly over the door seal with double sided tape. The microwave oven was then turned on and a level of 1 mw/cm$^2$ was observed on a Broadband Radiation Meter. The first liquid crystal box in the yellow caution zone on the detector card was lit displaying a "frowning face" after 2.5 seconds of exposure.

The opening of the microwave door was increased until the Broadband Radiation Meter indicated a 3 mw/cm$^2$ field. The second liquid crystal box in the upper orange caution lit displaying a "frowning face" after 2.5 seconds of exposure.

The opening of the microwave door was again increased until the Broadband Radiation Meter indicated a 5 mw/cm$^2$ field. The third liquid crystal box in the lower red danger zone lit displaying a "skull and cross bones" after 2.5 seconds of exposure.

Again the opening of the microwave door was increased until the Broadband Radiation Meter indicated a 7 mw/cm$^2$ field. The fourth liquid crystal box in the mid red danger zone lit displaying a "skull and cross bones" after 2.5 seconds of exposure.

Once again the opening of the microwave door was increased until the Broadband Radiation Meter indicated a 10 mw/cm$^2$ field. The fifth liquid crystal box in the upper red danger zone lit displaying a "skull and cross bones".

I claim:

1. A microwave leakage detector comprising:
a support member;
a plurality of liquid crystal test indicators disposed on the support member, the liquid crystal test indicators exhibiting color play within a first temperature range;
at least one liquid crystal control indicator disposed on the support member, the control indicator exhibiting coloring play within a second temperature range, the first temperature range being greater than the second temperature range; and
a region of resistive coating capable of being heated by microwave radiation disposed on the support member, and the resistive coating being disposed only under the plurality of liquid crystal test indicators.

2. A microwave leakage detector according to claim 1, wherein the first and second temperature ranges are mutually exclusive.

3. A microwave leakage detector according to claim 1, wherein the liquid crystal test indicators exhibit color play within different ranges inside the first temperature range.

4. A microwave leakage detector according to claim 1, wherein the liquid crystal control indicator is disposed on the support member at a location away from the resistive coating.

5. A microwave leakage detector according to claim 1, wherein each of the liquid crystal test and control indicators includes an image which becomes visible when the liquid crystal test and control indicators exhibit color play.

6. A microwave leakage detector according to claim 1, wherein the liquid crystal test indicators exhibit color play at temperatures of from 83° to 125° F.

7. A microwave leakage detector according to claim 1, wherein the liquid crystal control indicator exhibits color play at temperatures below 80° F.

8. A microwave leakage detector according to claim 1, wherein the liquid crystal control indicator and the liquid crystal test indicators are disposed linearly on a face of the support member.

9. A microwave leakage detector according to claim 1, wherein the support member has a thickness between 8 to 20 mil.

10. A microwave leakage detector according to claim 1, wherein the first temperature range corresponds to microwave radiation leakage levels of between 1 to 10 mw/cm$^2$.

11. A microwave leakage detector according to claim 1, wherein the liquid crystal test indicators include first, second, third, fourth, and fifth test indicators which exhibit color play at temperatures of 86-89° F, 90-96° F., 106-112° F., and 119-125° F, respectively.

12. A microwave leakage detector comprising:
a support member;
a region of resistive coating capable of being heated by microwave radiation disposed on the support member;
a plurality of liquid crystal test indicators disposed over and in thermal contact with the region of resistive coating, the liquid crystal test indicators exhibiting color play within a first temperature range; and
at least one liquid crystal control indicator disposed on the support member, the liquid crystal control indicator being thermally independent from the resistive coating, the control indicator exhibiting color play within a second temperature range, the first temperature range being greater than the second temperature range.

13. A microwave leakage detector according to claim 12, wherein the first and second temperature ranges are mutually exclusive.

14. A microwave leakage detector according to claim 12, wherein the liquid crystal test indicators exhibit color play within different ranges inside the first temperature range.

15. A microwave leakage detector according to claim 12, wherein the liquid crystal control indicator is disposed on the support member at a location away from the resistive coating.

16. A microwave leakage detector according to claim 12, wherein each of the liquid crystal test and control indicators includes an image which becomes visible when the liquid crystal test and control indicators exhibit color play.

17. A microwave leakage detector according to claim 12, wherein the liquid crystal test indicators exhibit color play at temperatures of from 83° to 125° F.

18. A microwave leakage detector according to claim 12, wherein the liquid crystal control indicator exhibits color play at temperatures below 80° F.

19. A microwave leakage detector according to claim 12, wherein the liquid crystal control indicator and the liquid crystal test indicators are disposed linearly on a face of the support member.

20. A microwave leakage detector according to claim 12, wherein the support member has a thickness between 8 to 20 mil.

21. A microwave leakage detector according to claim 12, wherein the first temperature range corresponds to microwave radiation leakage levels of between 1 to 10 mw/cm$^2$.

22. A microwave leakage detector according to claim 12, wherein the liquid crystal test indicators include first, second, third, fourth, and fifth test indicators which exhibit color play at temperatures of 86-89° F., 90-96° F., 97-103° F., and 119-125° F., respectively.

* * * * *